United States Patent [19]
Brown et al.

[11] Patent Number: 5,963,791
[45] Date of Patent: Oct. 5, 1999

[54] SILICON CARBIDE MOSFET HAVING SELF-ALIGNED GATE STRUCTURE AND METHOD OF FABRICATION

[75] Inventors: Dale Marius Brown; Richard Joseph Saia, both of Schenectady, N.Y.; John Adam Edmond, Apex; John Williams Palmour, Cary, both of N.C.

[73] Assignee: General Electric Company, Schenectady, N.Y.

[21] Appl. No.: 08/900,442

[22] Filed: Jul. 25, 1997

Related U.S. Application Data

[62] Division of application No. 07/925,823, Aug. 7, 1992, Pat. No. 5,726,463.

[51] Int. Cl.$^6$ .................................................. H01L 21/00
[52] U.S. Cl. ........................ 438/105; 438/270; 438/589; 438/931
[58] Field of Search ................................. 438/105, 931, 438/270, 271, 272, 269, 268, 589; 148/DIG. 148

[56] References Cited

U.S. PATENT DOCUMENTS

| | | | |
|---|---|---|---|
| 4,453,305 | 6/1984 | Janes et al. | 438/282 |
| 4,710,790 | 12/1987 | Okamoto et al. | 257/332 |
| 4,994,413 | 2/1991 | Eshita | 438/931 |
| 5,053,349 | 10/1991 | Matsuoka | 438/301 |
| 5,108,937 | 4/1992 | Tsai et al. | 438/282 |
| 5,170,231 | 12/1992 | Fujii et al. | 438/270 |
| 5,264,713 | 11/1993 | Palmour | 438/931 |
| 5,270,252 | 12/1993 | Papanicolaou | 438/931 |

FOREIGN PATENT DOCUMENTS

2-010772  1/1990  Japan ........................... 148/DIG. 148

*Primary Examiner*—Michael Trinh
*Attorney, Agent, or Firm*—Marvin Snyder; Douglas E. Stoner

[57] ABSTRACT

A SiC MOSFET having a self-aligned gate structure is fabricated upon a monocrystalline substrate layer, such as a p type conductivity α6H silicon carbide (SiC) substrate. An SiC n+ type conductivity layer is epitaxially grown on the substrate layer. A steep-walled groove is etched through the n+ SiC layer and partially into the p SiC layer at a location on the substrate where a MOSFET gate structure is desired. Subsequently, a thin layer of silicon dioxide and a layer of gate metal are successively deposited over the entire structure. The gate metal layer is deposited with sufficient thickness to substantially fill the groove. A layer of photoresist is applied to the entire surface of the gate metal layer. The photoresist and the underlying gate metal are then reactive ion etched down to the oxide layer, leaving gate metal remaining only in the groove. The gate metal and oxide layer form the self-aligned gate structure wherein the walls of the groove are automatically aligned with the edges of drain and source regions that are formed on either side of the groove.

6 Claims, 9 Drawing Sheets

SILICON CARBIDE MOSFET HAVING SELF-ALIGNED GATE STRUCTURE AND METHOD OF FABRICATION

This application is a division of application Ser. No. 07/925,823, filed Aug. 7, 1992, U.S. Pat. No. 5,726,463.

BACKGROUND OF THE DISCLOSURE

1. Field of the Invention

This invention relates to semiconductor devices, and more particularly to silicon carbide metal-oxide-semiconductor field effect transistors (MOSFETs) having self-aligned gate electrodes and a method of fabricating these MOSFETs.

2. Description of the Prior Art

Silicon carbide (SiC) is a crystalline substance that can withstand very high temperatures. Semiconductor devices manufactured on a SiC substrate can withstand temperatures in excess of 200° C. Thus, SiC based semiconductors are desirable for applications that require exposure to high temperatures.

An illustrative high temperature environment is the area near the exhaust of a gas turbine such as employed in an aircraft jet engine. Typically, high temperature sensors are used for monitoring the chemical content of the exhaust gases; however, electronic amplifiers for amplifying the sensor signals must be situated at some distance from the exhaust to avoid performance degradation or destruction on account of the high temperatures near the exhaust. Detrimentally, the signal level from the sensor is attenuated by resistive losses in the connective wiring as the signal propagates from the sensor to a remote amplifier. As a result, the signal-to-noise ratio (SNR) is reduced. Preferably, a sensor and an amplifier should be combined so that very little attenuation of the signal occurs as the signal passes from the sensor to the amplifier. Advantageously, a SiC semiconductor amplifier is capable of withstanding the high temperatures near a turbine exhaust outlet. Therefore, use of a combined SiC based semiconductor amplifier and sensor would result in improved exhaust monitoring apparatus.

Typically, sensor output signals are low level voltages. To amplify low level voltages, a high gain-bandwidth product, high input impedance amplifier is commonly used. Because most types of MOSFETs exhibit a high gain-bandwidth product and high input impedance, they are generally preferred over bipolar transistors for use in sensor signal amplifiers. However, techniques for manufacturing SiC MOSFETs with a sufficient gain-bandwidth product for use in high temperature amplifiers have previously been unavailable.

The theoretical maximum gain-bandwidth product of a typical MOSFET, i.e., neglecting all stray capacitance and resistance, is calculated using equation (1) as follows:

$$GBP = \frac{\mu_c(V_g - V_t)}{2\pi L^2} \quad (1)$$

where $\mu_c$ is the effective channel mobility, $V_g$ and $V_T$ are the gate and threshold voltages, respectively, and L is the length of the modulated surface channel. Reasonable values of $\mu_c$ (50 cm²/v-sec for p-channel devices and 300 cm²/v-sec for n-channel devices), $V_g-V_T$ (approximately 5 volts), and L (approximately 2 microns) yield gain-bandwidth products between 1 and 6 GHz. Inclusion of stray capacitances and parasitic admittances rapidly reduce this figure by an order of magnitude; therefore, MOSFET designs must be tailored to reduce stray capacitance and admittance to achieve performance approaching the ideal.

One design feature of a MOSFET that can be altered to reduce stray capacitance is overlap or misalignment of the gate and drain, or gate and source. Ideally, the gate should not overlap either the drain or the source since any overlap adds to the stray capacitance; however, complete elimination of the overlap is impossible for practical reasons. Nonetheless, use of self-aligning manufacturing techniques, i.e., techniques through which gate edges and drain and source region edges automatically and inherently align as a result of the manufacturing process, can produce MOSFETs having electrical characteristics that approach the ideal.

Manufacturing techniques that create self-aligning gate structures have heretofore been applicable only to the manufacture of silicon based MOSFETs. For example, such MOSFETs have been created using an ion implantation process to selectively bombard a silicon substrate with appropriate ions to produce regions of varying conductivity. Specifically, if the substrate is of p-type conductivity, a combination of a thick silicon dioxide pattern and a gate electrode on a thinner region of the silicon dioxide pattern are used to define those areas of the substrate that are to be implanted with n-type ions to form the source and drain regions of the MOSFET. The ions will penetrate the crystal lattice of the silicon substrate only in the areas which are exposed to the ion beam, i.e., not covered with thick oxide or oxide and gate metal. The portion of the silicon dioxide pattern lying beneath the gate electrode forms an insulating oxide layer for the MOSFET gate. The gate structure, (i.e., gate metal and gate oxide layer) is located between the newly formed source and drain regions.

Subsequent to ion implantation of the drain and source regions, the transistor substrate is heated in a furnace to activate the impurities and anneal the silicon lattice to remove lattice damage caused by the implantation of ions. Since the oxide layer and gate metal pattern were used as the ion implantation mask that defined the location of the drain and source regions prior to their formation, the edges of the gate structure are inherently aligned with the field edges of the source and drain regions without much, if any, overlap.

The alignment of the gate structure with the source and drain regions avoids excess gate-to-source and gate-to-drain capacitance. The low capacitance enables the silicon MOSFETs to operate at higher speeds, i.e., approaching the ideal gain-bandwidth product. Additionally, since the gate mask becomes a functional part of the MOSFET, the self-aligned process reduces the number of processing steps needed in making the transistor.

Unfortunately, the process for producing self-aligned gate structures for silicon MOSFETs is not applicable to silicon carbide MOSFETs, primarily owing to the need to anneal the substrate after it has been ion implanted. The annealing temperature for silicon carbide is so high (i.e., on the order of 1200° C. or higher) as to destroy the oxide layer mask and produce defects in the gate oxide beneath the gate electrode. Since, for the most part, the oxide mask is no longer present and the gate may be short-circuited to the channel region, the advantages of self-alignment are effectively unrealized. Corrective measures, such as attempting to redeposit or reform the oxide layer and gate electrode, require application of a gate electrode mask. Due to inaccuracies in mask alignment during the reformation process, corrective reformation of the gate structure is not effective at creating an aligned gate electrode. For example, limitations in manufacturing accuracy can result in an approximately 2.5μ uncertainty in alignment of a single mask over an existing pattern. Thus an overlap of up to 2.5μ between the gate and drain or source can result.

Given the ineffectiveness of using an ion implantation technique to form an aligned gate structure in SiC MOSFETs, manufacturers have employed an epitaxy process to form nonaligned gate structures. The epitaxy process for generating a nonaligned gate structure requires use of a mask to pattern a layer of metal into the gate electrode. As with the ion implantation process, the mask alignment error can be as much as 2.5µ; however, the extra processing step needed to reform a damaged gate produced by the ion implantation process is not necessary with epitaxy fabrication. Therefore, the epitaxy process is generally preferred over ion implantation for manufacturing SiC MOSFETs.

Thus, a need exists for SiC MOSFETs having aligned gate structures and for a method of manufacture that relies on an epitaxial process but enables SiC MOSFETs to be produced with aligned gate structures. Preferably, the gate structure should be self-aligning in the MOSFET manufacturing process.

SUMMARY OF THE INVENTION

Briefly, in accordance with a preferred embodiment of the invention, a SiC semiconductor device is fabricated upon a monocrystalline substrate layer, such as, for example, a p type conductivity, α6H silicon carbide monocrystalline substrate. A second layer, typically n+ type silicon carbide, is epitaxially grown on the first layer so as to form a two-layer monocrystalline silicon carbide structure. A groove is etched through the second layer and partially into the first layer at a location on the layered substrate where a MOSFET gate structure is desired, so that the side walls and bottom of the channel define the shape of the gate structure.

A thin layer of silicon dioxide is thereafter thermally grown upon the layered structure and a layer of gate metal is deposited over the silicon dioxide layer. The gate metal is deposited to a depth that substantially fills the groove. A layer of photoresist is next applied to the entire surface of the gate metal layer to planarize the surface. The photoresist and the underlying gate metal are then etched down to the oxide layer using reactive ion etching. Reactive ion etching removes the photoresist and the gate metal at the same rate, but removes the oxide at a much slower rate. The etch is stopped when an etching end point detector signals that all the photoresist has been removed. However, because the gate metal over the gate oxide in the groove resides at a depth lower than the oxide layer in the field exterior to the groove, and because of the etch rate differential between gate metal and silicon dioxide, the gate metal in the groove remains. The gate metal and oxide layer form a self-aligned gate structure having edges, i.e., the walls of the groove, aligned with the edges of the drain and source regions that are formed on either side of the groove. This process automatically and inherently aligns the edges of the gate electrode with the edges of the drain and source regions without substantial overlap. Subsequently, using well known processes, electrodes are attached to the drain and source regions to yield a useful high performance SiC MOSFET.

Accordingly, one object of the invention is to provide a SiC MOSFET having a self-aligned gate structure and with a relatively high gain-bandwidth product.

Another object of the invention is to provide a method of manufacturing a SiC MOSFET having a self-aligned gate structure.

Another object is to provide a method of manufacturing a SiC MOSFET using a relatively simple epitaxial deposition process.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

DETAILED DESCRIPTION

Although the invention is applicable to both n-channel and p-channel MOSFET devices and their manufacture, for purposes of simplicity the following description will consider fabrication only of a MOSFET having an n-channel.

Figure 1:
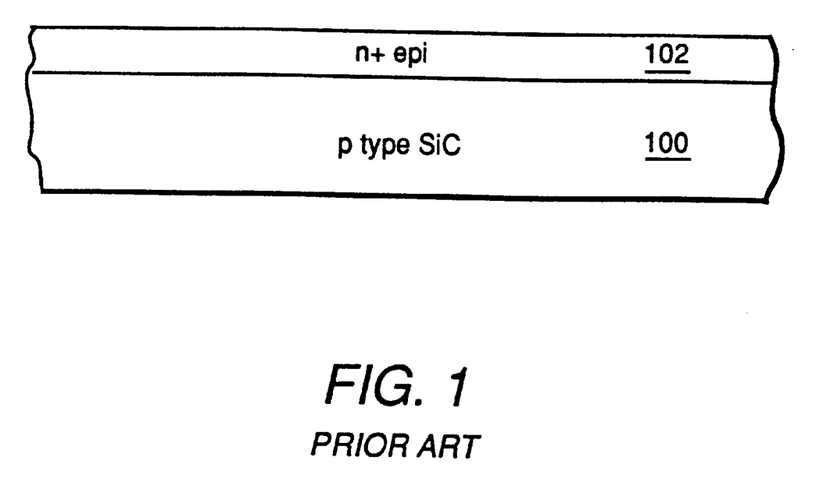
FIG. 1 depicts, in cross section, a p-type SiC substrate having an epitaxial layer grown thereon.

FIG. 1 depicts a SiC substrate 100 having a heavily-doped n type conductivity (designated n+) layer 102 of SiC epitaxially and uniformly deposited thereon. A typical dopant for n+ layer 102 may comprise nitrogen at a concentration of $10^{18}$–$10^{20}$ centimeters$^{-3}$. Substrate 100 is of an α6H monocrystalline structure, lightly doped to p type conductivity with a dopant such as aluminum or boron at a concentration of $10^{14}$–$10^{16}$ centimeters$^{-3}$. Although substrate 100 may support multitudes of individual transistors, as well known in the art, for simplicity the description will focus upon creation of one transistor having an annular structure or two transistors having linear structures.

Figure 2:
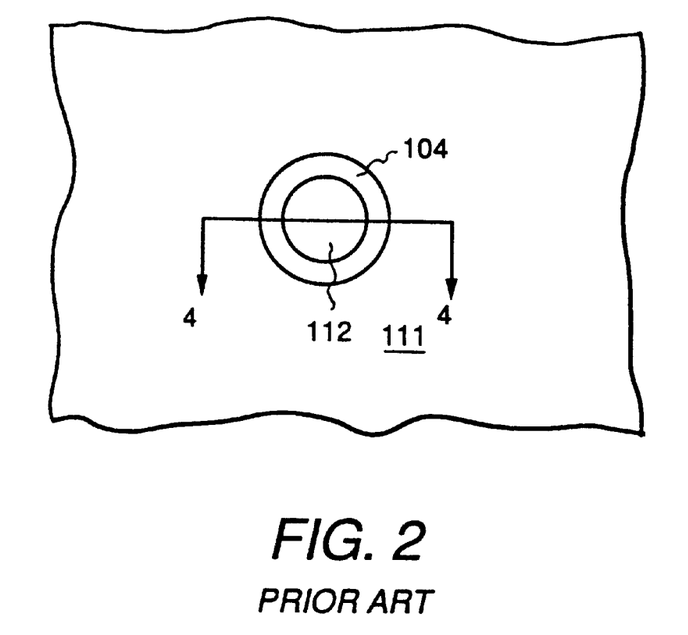
FIG. 2 is a top view of the structure shown in FIG. 1, with an annular groove cut through the epitaxial layer into the substrate.
Figure 3:
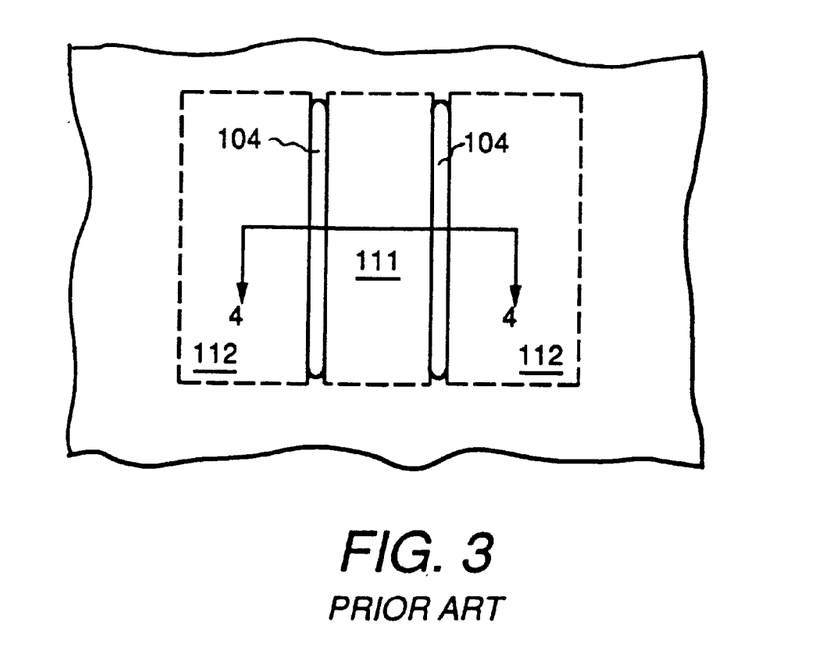
FIG. 3 is a top view of the structure shown in FIG. 1, with two linear grooves cut through the epitaxial layer into the substrate.
Figure 4:
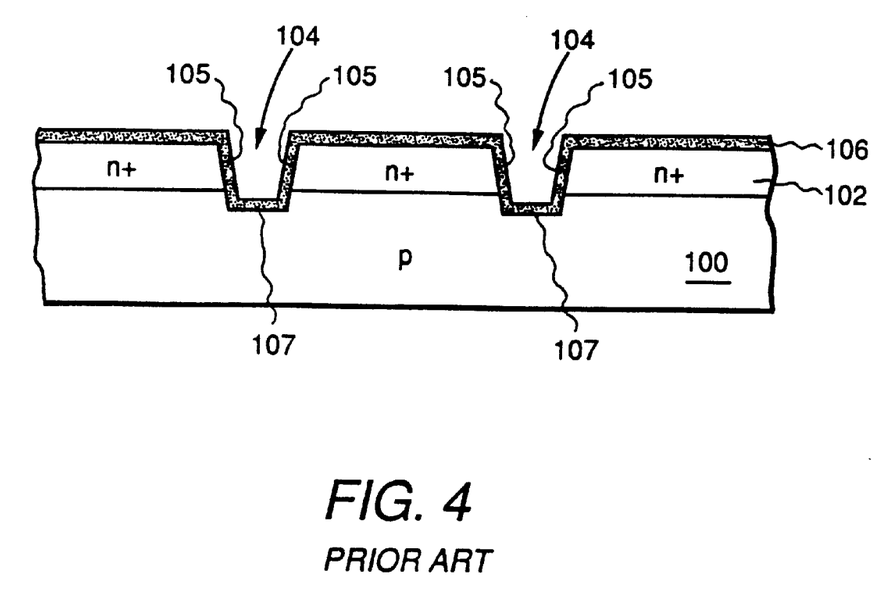
FIG. 4 is a cross-sectional view along line 4—4 in either FIGS. 2 or 3.

As shown in FIGS. 2, 3 and 4, grooves 104, having sidewall 105 and bottom 107, are etched through epitaxial layer 102 and into substrate 100. Each groove 104 defines a future location for a gate structure for each SiC MOSFET on the substrate. Groove shape may vary from an annular ring, as depicted in FIG. 2, to an arrangement of substantially rectangular slots which is depicted in FIG. 3 as two parallel grooves. The cross-sectional views of FIGS. 2 and 3 are the same, as shown in FIG. 4. However, the annular groove of FIG. 2 is used to generate a single annular transistor structure having drain region 112 circumscribed by the gate structure, while the groove pair shown in FIG. 6 is used to create a pair of transistors having parallel linear gate structures with source region 111 and drain region 112 on either side of each gate groove 104.

Figure 5:
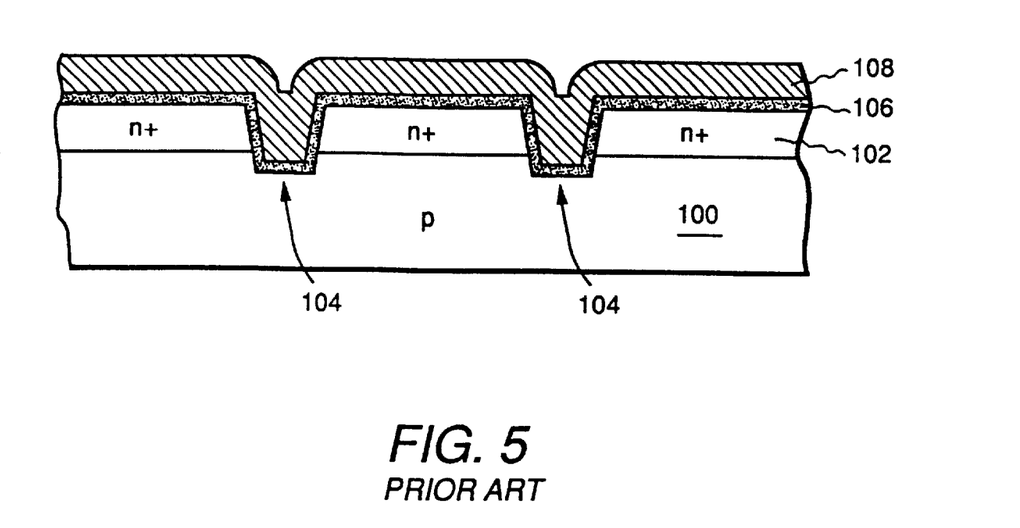
FIG. 5 depicts an oxide layer and a gate metal layer over the structure depicted in FIG. 4.

As shown in FIG. 4, after suitably shaped grooves have been cut, a thin silicon dioxide ($SiO_2$) layer 106 is thermally grown or deposited over the entire structure. Such silicon dioxide layer is sometimes referred to as an oxide layer. Subsequently, as FIG. 5 depicts, layer 108 of conductive gate material is deposited over silicon dioxide layer 106 to substantially fill grooves 104. The conductive material is deposited using well known sputtering or chemical vapor deposition (CVD) techniques. Commonly used conductive gate materials include polycrystalline silicon, aluminum, molybdenum, and tungsten.

Figure 6:
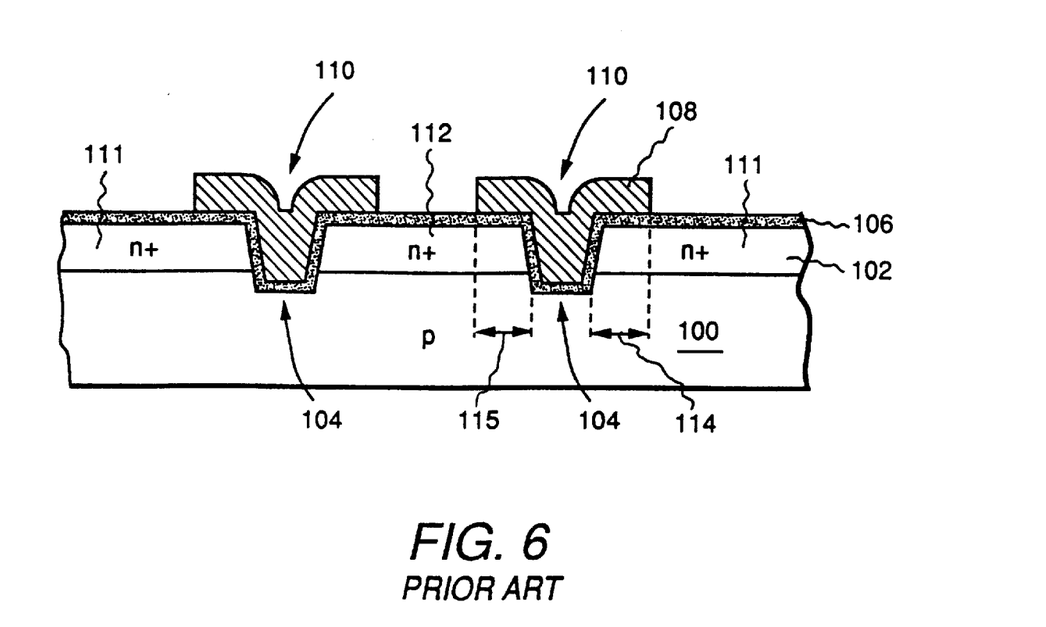
FIG. 6 depicts, in cross section, a conventional MOSFET having a nonaligned gate structure produced in accordance with a prior art process.

In a prior art method used to form gate structure 110, shown in FIG. 6, gate metal 108, shown in FIG. 5, is masked in a desired pattern and etched in that pattern to arrive at the completed gate structure depicted in FIG. 6.

The MOSFET is formed by gate structure 110, drain region 111, and source region 112. Gate structure 110 includes gate metal 108 and silicon dioxide layer 106 beneath the gate metal. Gate metal 108 overlaps source region 111 by a distance 114 and overlaps drain region 112 by a distance 115; i.e. the edges of the gate structure are not aligned with the source and drain regions. As a result of manufacturing limitations on mask alignment, the misalignment can amount to 2.5μ.

The present invention avoids such misalignment by not using a mask to generate the gate. In that regard, FIGS. 7 through 10 depict a preferred embodiment of the invention.

Figure 7:
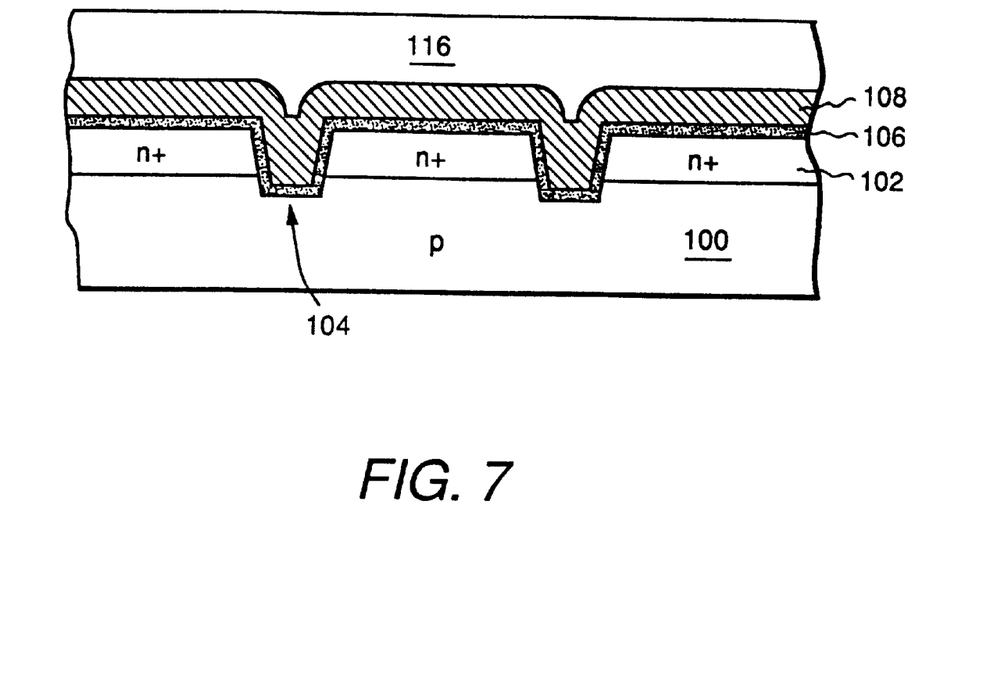
FIG. 7 depicts a layer of photoresist deposited over the structure shown in FIG. 5.

FIG. 7 illustrates, in cross section, a structure having a uniform layer 116 of photoresist material applied over gate material 108. Photoresist layer 116 may additionally be patterned elsewhere on the substrate to produce conductive trace interconnections (not shown). However, for generating the self-aligned gate structure, the photoresist is not patterned over the gate location. Both photoresist layer 116 and conductive gate layer 108 are removed simultaneously to a uniform depth preferably by reactive ion etching. The etch is stopped when an etching end point detector signals that all the photoresist has been removed.

Figure 8:
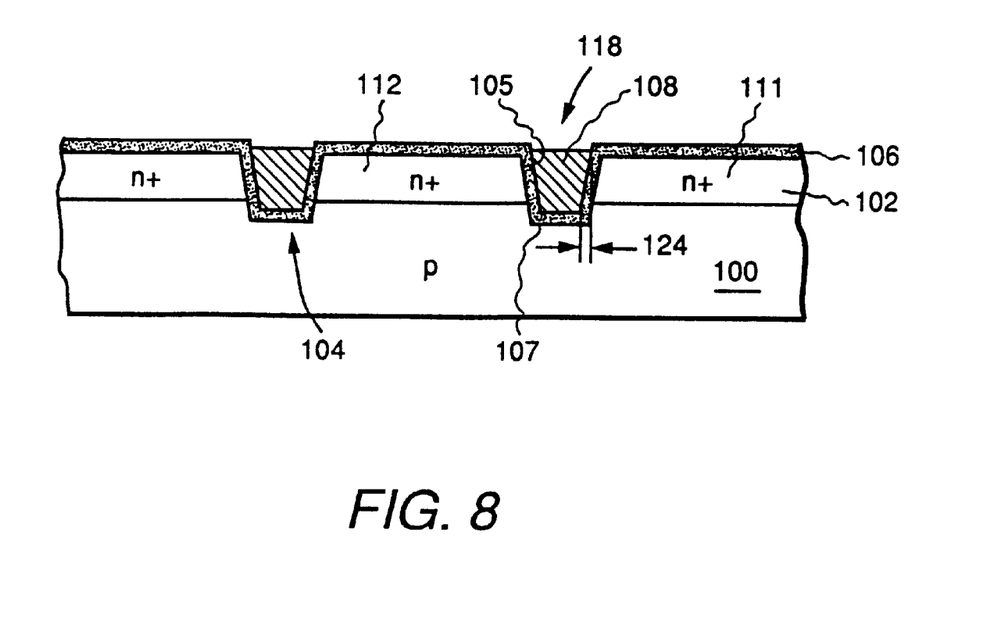
FIG. 8 depicts the structure of FIG. 7 with the photoresist and gate etched in accordance with the present invention.

As indicated in FIG. 8, conductive gate material layer 108 is removed down to oxide layer 106. Due to the increased thickness of conductive gate material 108 within each groove 104, a portion of conductive gate material 108 remains in each such groove after the etching procedure has been completed. This remaining portion of conductive gate material 108 in cooperation with underlying silicon dioxide layer 106 forms a self-aligned gate structure 118 between drain region 112 and source region 111.

Gate structure 118 is defined by the sides 105 and bottom 107 of groove 104. Thus, the edges of gate structure 118 (corresponding to the sides of groove 104) are substantially aligned with the edges of drain region 112 and source region 111. The length of misalignment 124 is a function of the slope of sides 105 of groove 104; i.e., the steeper the slope of groove sides 105, the smaller the misalignment.

In comparing the overlap 114 of a conventional gate structure as shown in FIG. 6, to the overlap 124 of the self aligned gate structure of the present invention, shown in FIG. 8, significant advantages of the invention become apparent. The reduction in overlap area decreases the gate-to-drain and gate-to-source capacitances, thus improving the speed or bandwidth of the device. Additionally, MOSFETs formed according to the invention can be more densely packed onto a substrate than conventionally formed MOSFETs since no additional substrate area is needed to accommodate overlap.

Figure 9:
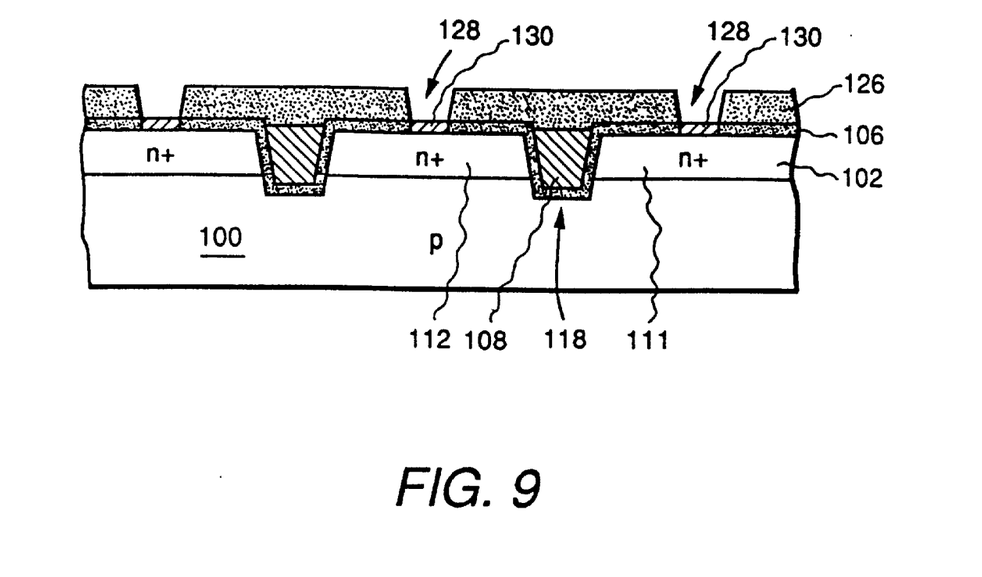
FIG. 9 depicts a layer of dielectric material deposited over the structure of FIG. 8 with windows etched through the dielectric layer to access the drain and source regions.
Figure 10:
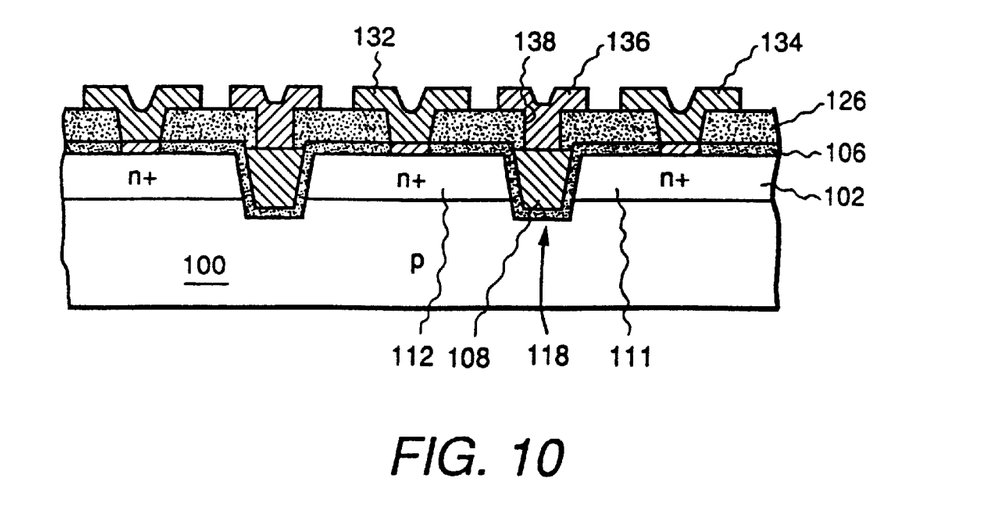
FIG. 10 depicts, in cross section, a complete MOSFET having, as first level metallizations, drain, gate, and source metal electrodes, fabricated in accordance with the present invention.

FIG. 9 illustrates a cross section of the structure of a SiC MOSFET having a layer 126 of dielectric material, generally silicon dioxide, applied over the layered structure shown in FIG. 8. Also depicted are windows 128 extending through dielectric layer 126 and silicon dioxide layer 106 to access drain region 111 and source region 112. To facilitate conductive contact to the drain and source regions 111 and 112, sintered contact metal 130, such as nickel, is deposited in each window 128 as shown in FIG. 10, and a window 138 is etched through dielectric 126 to access self-aligned gate structure 118. A metallization pattern is applied using standard techniques to create first level drain contacts 132, source contacts 134, and gate contacts 136 of each SiC MOSFET on substrate 100.

Figure 11:
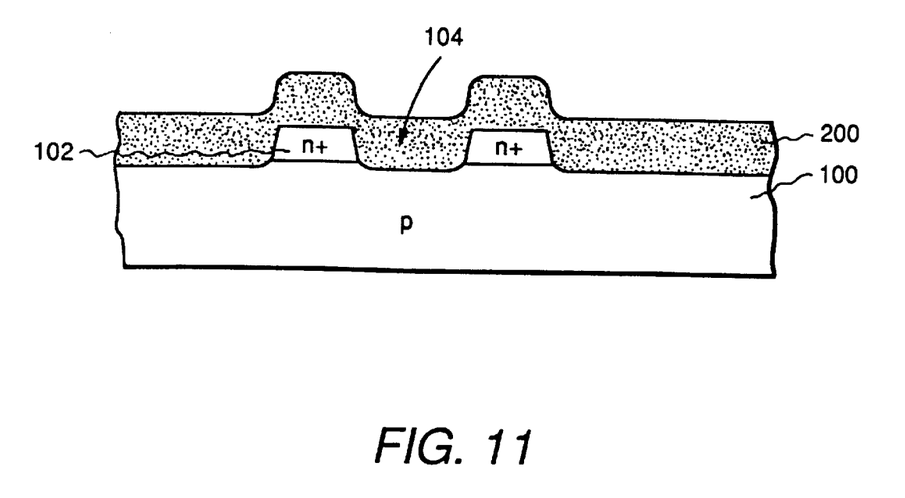
FIG. 11 is a cross-sectional view of a layered structure having a SiC substrate with a grooved epitaxial layer grown thereon and a silicon dioxide layer deposited over the substrate and epitaxial layer.

An alternative preferred embodiment of the inventive process for fabricating a SiC MOSFET having a self-aligned gate structure is illustrated in cross section in FIGS. 11 through 14. Beginning with the structure shown in FIG. 1, a gate defining groove 104 is etched into epitaxial layer 102, as shown in FIG. 11, and a uniformly thick silicon dioxide layer 200 is applied over epitaxial layer 102 and substrate 100 to a depth sufficient to substantially fill groove 104.

Figure 12:
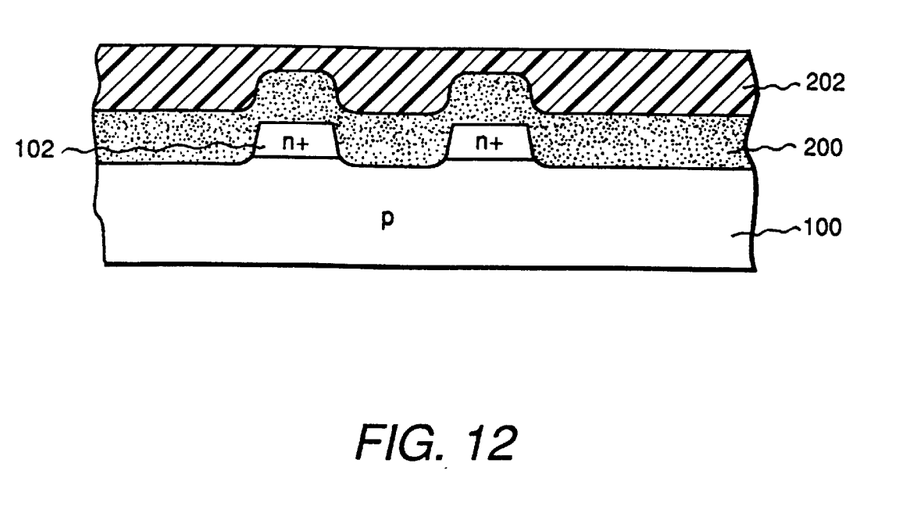
FIG. 12 depicts a layer of photoresist deposited over the layered structure shown in FIG. 11.
Figure 13:
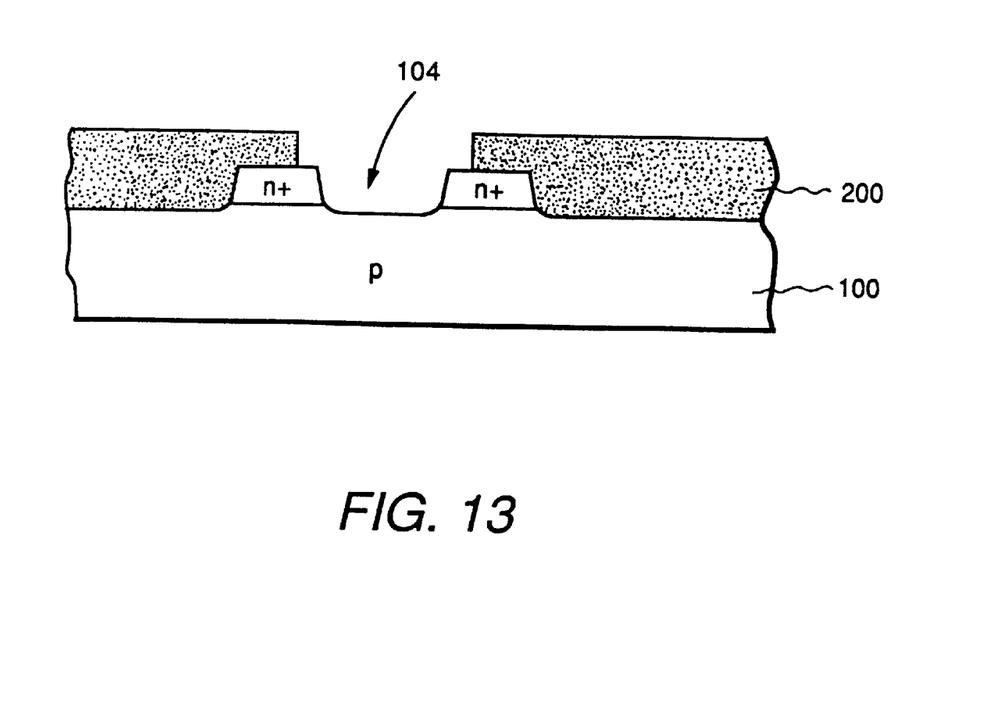
FIG. 13 depicts a structure having a photoresist layer and a portion of a silicon dioxide layer etched in accordance with the invention.

Thereafter, as shown in FIG. 12, a photoresist layer 202 is deposited over silicon dioxide layer 200 by either spin-deposition or flow-deposition. Using standard photolithography processes, the photoresist is patterned such that the region of $SiO_2$ layer 200 covering groove 104 is removed while the remainder of the $SiO_2$ layer is left intact. FIG. 13 depicts the resulting structure after the remainder of the photoresist layer has been removed, showing an opening in $SiO_2$ layer 200 aligned with groove 104.

Figure 14:
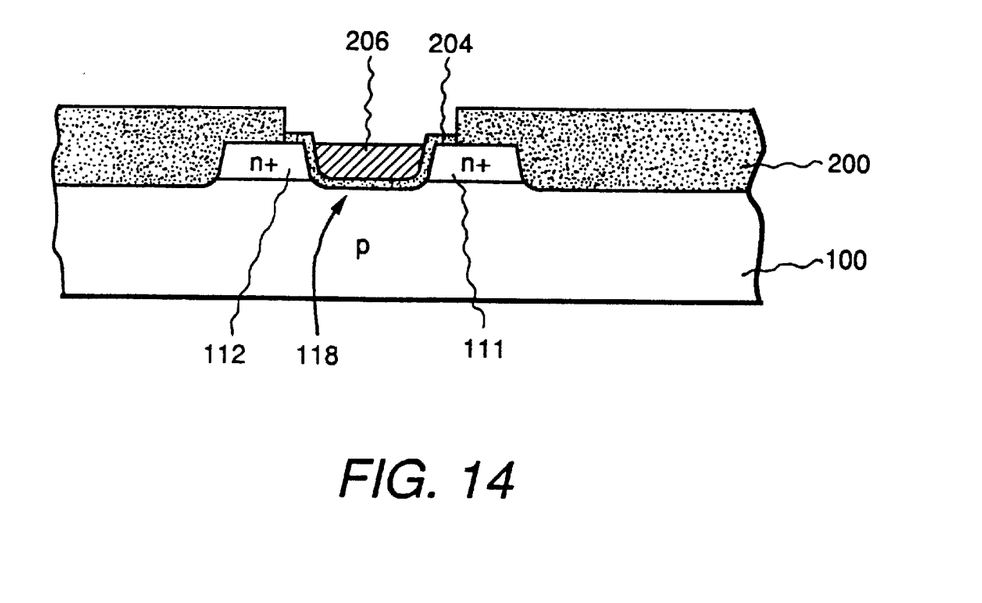
FIG. 14 depicts, in cross section, a structure having gate metal and gate oxide layers deposited in the groove shown in FIG. 11, in accordance with the invention.

Subsequently, as illustrated in FIG. 14, a gate $SiO_2$ layer 204 and conductive gate material 206 are applied in sequential steps over the entire structure, and are then etched, as discussed with respect to FIGS. 7 and 8, to leave a self-aligned gate structure between drain region 112 and source region 111. Subsequently, the SiC MOSFET is completed in a manner similar to that discussed with respect to FIGS. 9 and 10. As shown in FIG. 14, gate metal 206 is exposed and can be readily attached to a landing pad (not shown). However, connective conduits must be cut to access drain and source regions 111 and 112, respectively.

Figure 15:
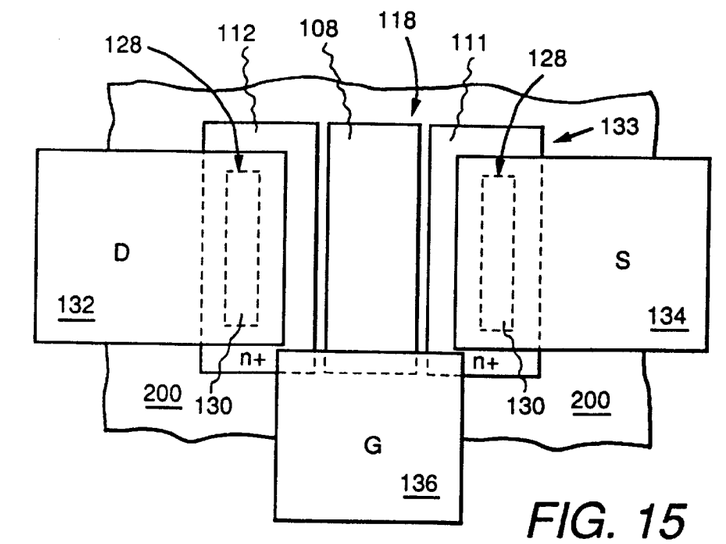
FIG. 15 depicts a top view of a single linear gate SiC MOSFET manufactured in accordance with the invention.

FIG. 15 is a top view of a MOSFET 133 formed in accordance with the alternative preferred embodiment of the invention described in conjunction with FIGS. 7–10. MOSFET 133 is a single transistor having drain region 112, linear gate region 118, and source region 111. Not visible in FIG. 15 is the portion of $SiO_2$ layer 200 that forms a nonconductive barrier between electrodes 132 and 134 and SiC source 111 and drain 112 regions, respectively. To facilitate connecting source 111 and drain 112 regions to electrodes 132 and 134, conduits 128 are cut through layer 200. Each of the source and drain regions is accompanied by connective metallization such that drain region 112 is connected to drain electrode 132 via sintered metal 130 deposited in conduit 128, source region 111 is connected to source electrode 134 via sinter metal 130 deposited in conduit 128, and gate electrode 108 is connected to gate landing pad 136. Gate electrode 108 is preferably of a different metal (e.g. tungsten) than gate landing pad 136 (e.g. molybdenum) so that when the gate pad is patterned, the gate electrode metal is not etched.

Figure 16:
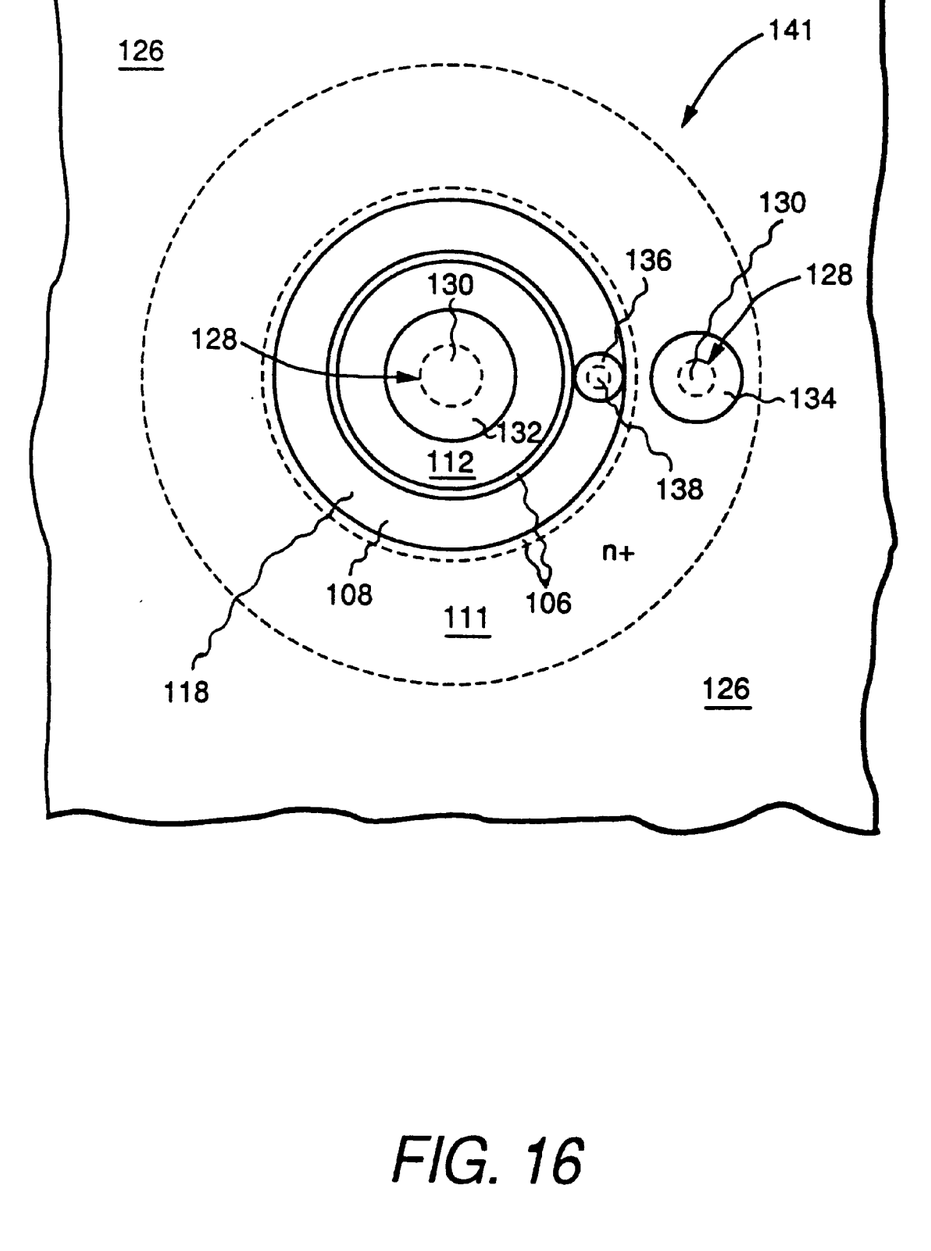
FIG. 16 depicts a top view of a single annular gate SiC MOSFET manufactured in accordance with the invention.

FIG. 16 is a top view of a MOSFET 141 fabricated in accordance with the preferred embodiment of the invention described in conjunction with FIGS. 11–14. MOSFET 141 is a single transistor having an annular gate structure 118 that circumscribes drain region, 112. As more explicitly depicted in FIGS. 9 and 10, conductive contacts to drain region 112 and source region 111 are made via windows 128 through dielectric layer 126, and contact to gate structure 118 is accomplished via window 138. First level electrodes 134, 132 and 136, also known in the art as landing pads, attach to each transistor region through windows 128 and 138.

SiC MOSFETs such as those depicted in FIGS. 15 and 16 can be used in devices such as amplifiers, integrated circuits, and sensors. Generally, a SiC MOSFET can be substituted for a silicon based MOSFET in any application. However, because SiC MOSFETs can withstand greater temperatures than silicon based MOSFETS, SiC MOSFETs are well suited for amplifiers and integrated circuits used in high temperature environments. Additionally, while high power handling circuits, such as power amplifiers, generate large amounts of heat that can cause silicon transistors to break down, the high temperature resiliency of SiC MOSFETs makes them well suited for use in high power applications also.

Figure 17:
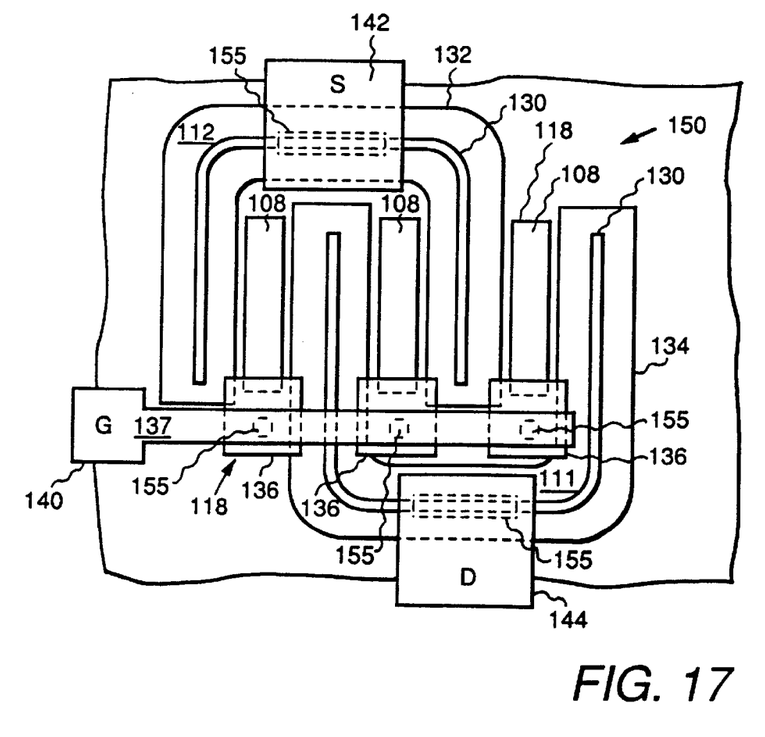
FIG. 17 depicts a top view of a power linear gate SiC MOSFET device manufactured in accordance with the invention.

FIG. 17 depicts a high power handling device for MOSFETs having self-aligned gates constructed in accordance with the present invention. Therein, three transistors, each having a linear self-aligned gate structure, are fabricated upon a single substrate 100 and connected together to form a single MOSFET device 150. The transistors are electrically connected in a parallel orientation to enable MOSFET device 150 to handle high power such that the single power MOSFET device 150 has a single gate electrode 140, source electrode 142 and drain electrode 144. Conductive connections from the electrodes to the underlying transistor regions are accomplished in a manner similar to that discussed with respect to the single transistor shown in FIG. 15. However, to accomplish the parallel gate connections, a second insulating dielectric layer (not shown) is deposited over the entire three transistor device after gate landing pads 136 and drain and source electrodes 132 and 134, respectively, have been created. Conduits 155 are subsequently etched through the second insulating layer to permit access to each gate landing pad 136 and source and drain electrodes 132 and 134 associated with each transistor. A metal layer is deposited over second dielectric layer 152 and patterned to create a metal trace 137 for connecting the gate landing pads 136 together in parallel and to provide a lead bonding pad as gate electrode 140 at the distal end of trace 137. Simultaneously, the patterning process creates lead bonding pads as source and drain 142 and 144, respectively.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method of fabricating a metal oxide semiconductor device having a self-aligned gate structure comprising the steps of:

epitaxially depositing, upon a first silicon carbide layer of a first conductivity type, a uniformly deposited second silicon carbide layer of a second conductivity type, said first and second layers forming a monocrystalline silicon carbide structure;

patterning said uniformly deposited second layer to form a steep-walled groove therein;

applying a gate oxide layer over said second layer;

depositing a gate metal layer upon said gate oxide layer;

depositing a layer of photoresist material upon said gate metal layer;

etching said layer of photoresist material and said gate metal layer until said gate metal layer remains substantially only within said groove whereby said gate oxide layer and the remaining portion of said gate metal layer form a self-aligned gate structure; and attaching electrodes to said gate metal layer and through said oxide layer to said second silicon carbide layer, wherein the attaching step further comprises the steps of:

depositing a dielectric layer upon said gate oxide layer and said remaining portion of said gate metal layer;

etching contact windows through said dielectric layer and said gate oxide layer to said second silicon carbide layer;

depositing a sintered contact metal within said windows;

opening a gate contact window through said dielectric layer to said remaining portion of said gate metal layer;

depositing in a selected pattern a metal layer to contact said sintered contact metal to form a source electrode and a drain electrode; and depositing in a selected pattern a metal layer to contact said remaining portion of said gate metal layer to form a gate landing pad.

2. The method of claim 1 wherein said first silicon carbide layer comprises p type silicon carbide and said second silicon carbide layer comprises n type silicon carbide.

3. A method of fabricating a metal oxide semiconductor device having a self-aligned gate structure comprising the steps of:

epitaxially depositing, upon a first silicon carbide layer of a first conductivity type, a second silicon carbide layer of a second conductivity type, said first and second layers forming a monocrystalline silicon carbide structure;

patterning said second silicon carbide layer to form a steep-walled groove therein;

applying a thick oxide layer upon said second silicon carbide layer with sufficient depth to fill said groove;

patterning said thick oxide layer to form an opening therein in registry with said groove;

applying a gate oxide layer to the walls and bottom of said groove so as to line said walls and bottom of said groove therewith;

depositing a gate metal layer upon said gate oxide layer, said gate metal layer being wholly contained within said groove;

depositing a dielectric layer upon said gate metal layer and exposed portions of said gate oxide layer in said groove;

opening a first window in said dielectric layer to said gate metal layer;

opening second and third windows in said thick oxide layer to said second silicon carbide layer on either side of said groove; and depositing a conductive material in each of said first, second and third windows to make contact with said gate metal layer so as to form a gate electrode, and to make contact with said second silicon carbide layer on either side of said groove so as to form a source electrode and a drain electrode respectively.

4. The method of claim 3 wherein the step of depositing a conductive material in each of said first, second, and third windows comprises the steps of:

depositing a sintered contact metal within said second and third windows;

depositing a metal layer to contact said sintered contact metal to form said source and drain electrodes; and depositing a metal layer to contact said gate metal layer to form said gate electrode.

5. The method of claim 3 wherein said first silicon carbide layer comprises p type silicon carbide and said second silicon carbide layer comprises n type silicon carbide.

6. The method of claim 4 wherein said first silicon carbide layer comprises p type silicon carbide and said second silicon carbide layer comprises n type silicon carbide.

* * * * *